United States Patent
Ahuja et al.

(10) Patent No.: US 6,281,747 B2
(45) Date of Patent: Aug. 28, 2001

(54) POWER EFFICIENT LINE DRIVER

(75) Inventors: Bhupendra K. Ahuja, Fremont; Cary L. Delano; Adya S. Tripathi, both of San Jose, all of CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

(21) Appl. No.: 09/769,234

(22) Filed: Jan. 24, 2001

Related U.S. Application Data (63) Continuation of application No. 09/432,507, filed on Nov. 2, 1999.
(60) Provisional application No. 60/123,549, filed on Mar. 9, 1999.

(51) Int. Cl.[7] .................. H03F 1/36; H03F 1/34; H03F 3/04
(52) U.S. Cl. ............. 330/109; 330/294; 330/302; 330/297
(58) Field of Search .................. 330/107, 109, 330/294, 302, 306, 297

(56) References Cited

U.S. PATENT DOCUMENTS

| | | | |
|---|---|---|---|
| 3,806,828 | 4/1974 | Johnson | 330/109 |
| 4,458,208 * | 7/1984 | Abe | 330/10 |
| 5,237,288 | 8/1993 | Cleveland | 330/107 |
| 5,440,270 | 8/1995 | Sevastopoulos et al. | 330/107 |
| 5,510,753 * | 4/1996 | French | 330/297 |
| 5,606,289 * | 2/1997 | Williamson | 330/297 |
| 5,712,593 | 1/1998 | Buer et al. | 330/129 |
| 5,805,020 | 9/1998 | Danz et al. | 330/10 |
| 5,969,575 | 10/1999 | Helms | 330/294 |
| 6,002,229 | 12/1999 | Thomsen | 330/107 |
| 6,081,161 * | 6/2000 | Dacus et al. | 330/297 |
| 6,084,468 * | 7/2000 | Sigmon et al. | 330/207 A |

* cited by examiner

*Primary Examiner*—Robert Pascal
*Assistant Examiner*—Patricia T. Nguyen
(74) *Attorney, Agent, or Firm*—Beyer Weaver & Thomas, LLP (57) ABSTRACT

A signal processing circuit is described including a frequency selective network in a feedback loop. An analog-to-analog converter in the feedback loop is coupled to the frequency selective network. A continuous-time feedback path provides feedback from the output terminal of the analog-to-analog converter to the frequency selective network.

16 Claims, 13 Drawing Sheets

POWER EFFICIENT LINE DRIVER

RELATED APPLICATION DATA

The present application is a continuation U.S. patent application Ser. No. 09/432,507 for POWER EFFICIENT LINE DRIVER filed on Nov. 2, 1999, which claims priority from U.S. Provisional Patent Application No. 60/123,549 for POWER EFFICIENT LINE DRIVER filed on Mar. 9, 1999, the entireties of both of which are incorporated herein by reference for all purposes.

BACKGROUND OF THE INVENTION

The present invention relates to signal processing techniques for providing high fidelity signal amplification with high power efficiency. More specifically, the present invention provides techniques by which distortion in all classes of amplifiers including, for example, power supply transitioning artifact in a class G amplifier, may be reduced to provide a low distortion output signal.

In general, improvements in the power efficiency of electronic amplifiers and line drivers are desirable. In communications, a line driver is used to drive telecom or datacom signals on physical interfaces such as, for example, subscriber loop copper lines. Likewise, in audio/industrial applications, electronic amplifiers are used to drive speakers or other electrical loads. Power transfer efficiency is a critical design issue especially for applications characterized by a high peak-to-average power ratio such as, for example, the driving of copper subscriber loops or high fidelity audio loudspeakers. In such applications, it is not unusual for output power levels to range from a few hundred milliwatts to tens or even hundreds of watts. It is also typical for such applications that the peak output power far exceeds the average power delivered to the load, i.e., that the periods of high power dissipation constitute a relatively small percentage of the operating time of the driver or amplifier. And, even though it far exceeds the output voltage swing for the great majority of circuit operation, the supply voltage must be large enough to exceed the output voltage swing during periods of peak power dissipation in order to keep high signal fidelity (or low distortion). Thus, during periods in which the output voltage swing is relatively low, i.e., most of the time, the efficiency of the circuit is very low due to the fact that the supply voltage is much greater than it needs to be.

Power efficiency is further degraded due to the fact that supply voltages tend to be set significantly higher than the predicted peak output voltage swing to maintain output signal distortion within acceptable limits. That is, as the output voltage of an amplifier approaches the power supply rails, signal distortion tends to increase dramatically. As a result, most circuit designers tend to use supply voltages which exceed the expected peak output voltage swing by as much as 20% or more.

An example of the inefficiency of an application in which the peak-to-average power ratio is 5 will be instructive. If the average power transmitted is 200 mW into a 50 ohm load, the RMS value of the output voltage is 3.162 volts and the average peak value is 1.4142*3.162=4.47 volts. That is, most of the time, the output signal swings between ±4.47 volts. For a peak-to-average ratio of 5, this means that the output voltage can swing as high as 5*3.162=15.81 volts. To maintain appropriately low distortion levels during periods of peak power dissipation, such a peak output voltage justifies the use of a ±15 volt supply. This results in a dissipation of greater than 800 mW to deliver 200 mW into the load. Thus, in such a configuration, even a well designed class AB amplifier will operate at less than 20% efficiency.

Class D amplifiers, i.e., switching amplifiers, address the problem of power efficiency but, in general, are characterized by more signal distortion than comparable analog amplifiers, especially as the output signal swing approaches the power supply rails. In addition, such amplifiers are particularly susceptible to degradation from electromagnetic interference (EMI). A switching amplifier has been developed by Tripath Technology, Inc. of Santa Clara, Calif., which improves upon switching amplifier technology generating output signals having distortion levels comparable with high fidelity analog amplifiers. An example of such a switching amplifier is described in U.S. Pat. No. 5,777,512 for METHOD AND APPARATUS FOR OVERSAMPLED, NOISE-SHAPING, MIXED-SIGNAL PROCESSING issued Jul. 7, 1998, the entirety of which is incorporated herein by reference for all purposes.

However, at switching frequencies significantly above audio bandwidths, the oversampling employed by the improved switching amplifier of the above-referenced patent may result in switching losses which begin to undermine power efficiency gains. That is, for communications applications such as ISDN and the various xDSL standards where bandwidths range from 30 kHz to 1.2 MHz, the switching losses in the output devices in switching applications may be unacceptably high; particularly for a switching technique which relies on oversampling and thus has an even higher switching rate than standard switching techniques.

Figure 1:
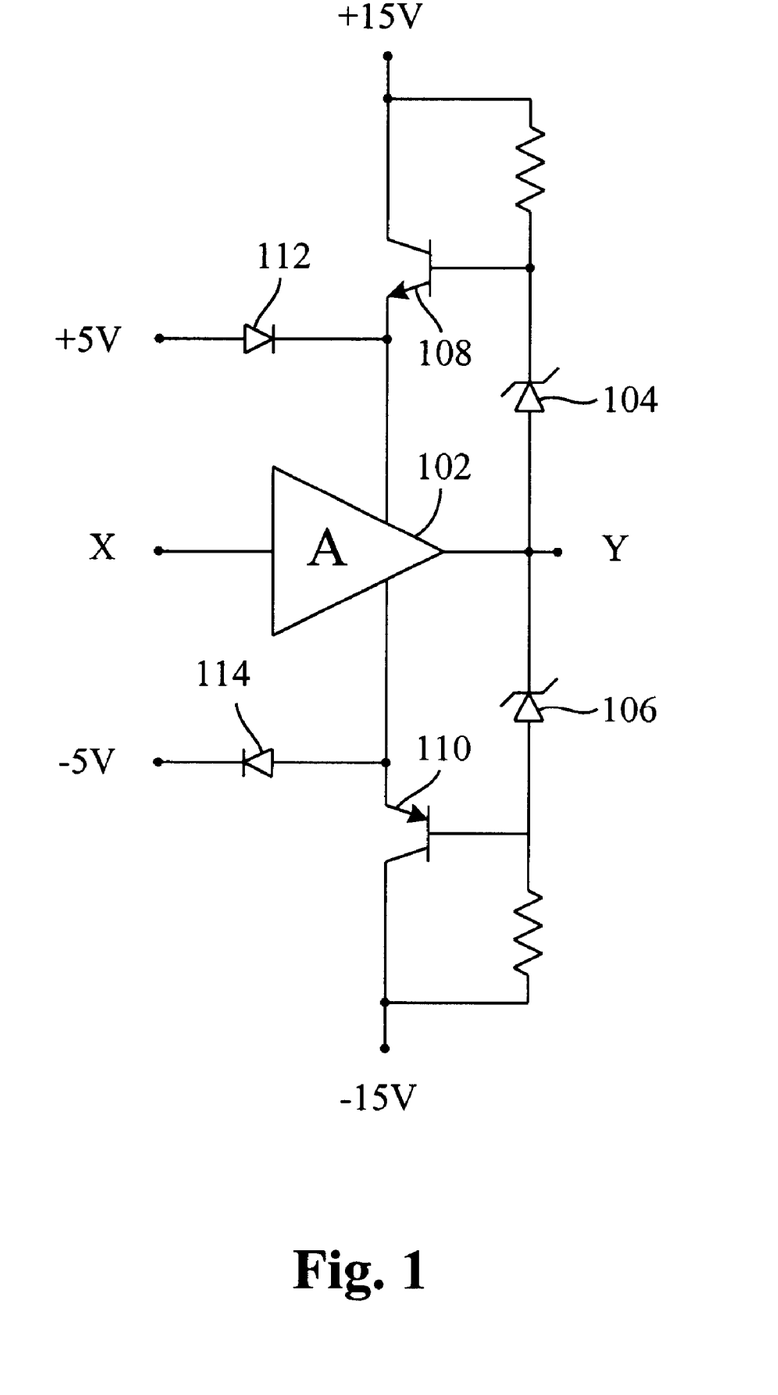
FIG. 1 is a representation of a standard class G amplifier.

One approach to improving power efficiency for high peak-to-average ratio applications has been the so called Class G amplifier for which the output signal remains analog in nature. SGS Thompson has used this class of amplifiers for audio applications, an example of which is shown in FIG. 1. During operation, amplifier 102 is alternately connected to two different supply voltages ±5V and ±15 V. When the output peak signal is less than roughly 4.3V (depending upon the voltage of zener diode 104), then the ±5V supply is connected to amplifier 102 via diode 112. When the output peak signal exceeds 5 volts less the voltage of diode 104, then the ±15V supply is connected to amplifier 102 via NPN transistor 108. That is, when the output signal is below a certain level, amplifier 102 is connected to the ±5V supply via diodes 112 and 114. When the output voltage rises high enough, amplifier 102 is connected to the ±15V supply.

Through the power supply switching technique described with reference to FIG. 1, a class G amplifier can improve power efficiency by varying degrees depending upon how often the signal is diverting power to 5V. A class G amplifier always has a higher average efficiency than a class AB amplifier if the signal being passed is not a DC signal greater than some threshold. Unfortunately, while this improvement can be significant, there is a corresponding increase in output signal distortion due to the power supply transition noise coupling into the circuit. This coupling can also be mixed to other frequencies by the nonlinearities of the amplifier/output stage. In communications applications, increased signal distortion leads to an increased bit error rate. In audio applications, increased distortion leads to a perceptible degradation in sound quality. Thus, despite its power efficiency improvements, the standard class G amplifier is unacceptable for applications in which signal distortion must be kept low.

Another tradeoff in linear amplifier design is bias current vs. linearity. Generally speaking, a higher bias current results in a more linear output. By contrast, reducing bias current, while improving power efficiency, results in increased distortion as the load gets smaller. This is a classical and well documented tradeoff in the design of a variety of amplifier classes, e.g., class A, AB, etc.

It is therefore desirable to provide an amplifier topology with an increased power efficiency which generates an output signal with low enough distortion, for example, for use in communications, high fidelity audio applications, and in any application with a high peak-to-average ratio.

SUMMARY OF THE INVENTION

According to the present invention, an improved amplifier topology is provided which may be used to improve the performance of amplifiers of any class including, for example, class A, B, AB, C, D, E, F, G, and H. The amplifier topology of the present invention employs a noise shaping technique to reduce output signal distortion significantly with respect to an equivalent standard amplifier while maintaining a high power efficiency. The amplifier of the present invention is configured in a feedback loop with a distortion filter which employs continuous-time feedback from the output of the amplifier to shape the noise characteristic of the input to the amplification stage. The noise shaping provided by the distortion filter reduces the consequences of the tradeoff between bias current and distortion discussed above. That is, because the distortion filter results in very low levels of distortion, bias current may be reduced for a given linearity thereby resulting in a corresponding improvement in power efficiency.

According to a specific embodiment, the distortion filter comprises one or more integrator (or resonator) stages each of which receives continuous-time feedback scaled with an appropriate feedback coefficient. By properly selecting the feedback coefficients the forward transfer function of the feedback loop is made equal to the gain value of the amplification stage of the amplifier in the frequency band of interest. This results in significant attenuation of distortion within the same band.

Thus, according to the invention, a signal processing circuit is provided which includes a frequency selective network in a feedback loop. An analog-to-analog converter in the feedback loop is coupled to the frequency selective network. A continuous-time feedback path provides feedback from the output terminal of the analog-to-analog converter to the frequency selective network.

According to a specific embodiment, the frequency selective network comprises a distortion filter having a plurality of stages. According to a more specific base band embodiment, the plurality of stages of the distortion filter comprises a plurality of integrators. According to an alternate band pass embodiment, the plurality of stages comprises a plurality of resonators.

As mentioned above, the present invention may be employed with any of a variety of amplifier/driver classes. Thus, according to various embodiments, the analog-to-analog converter comprises amplifiers/drivers of class A, AB, B, C, E, F, G, and H.

A further understanding of the nature and advantages of the present invention may be realized by reference to the remaining portions of the specification and the drawings.

DESCRIPTION OF SPECIFIC EMBODIMENTS

Figure 2A:
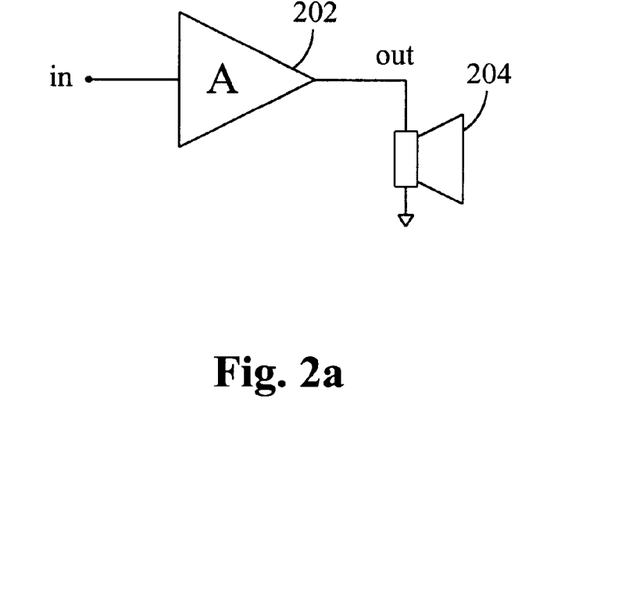
FIG. 2a is a simplified schematic of an audio amplifier.
Figure 2B:
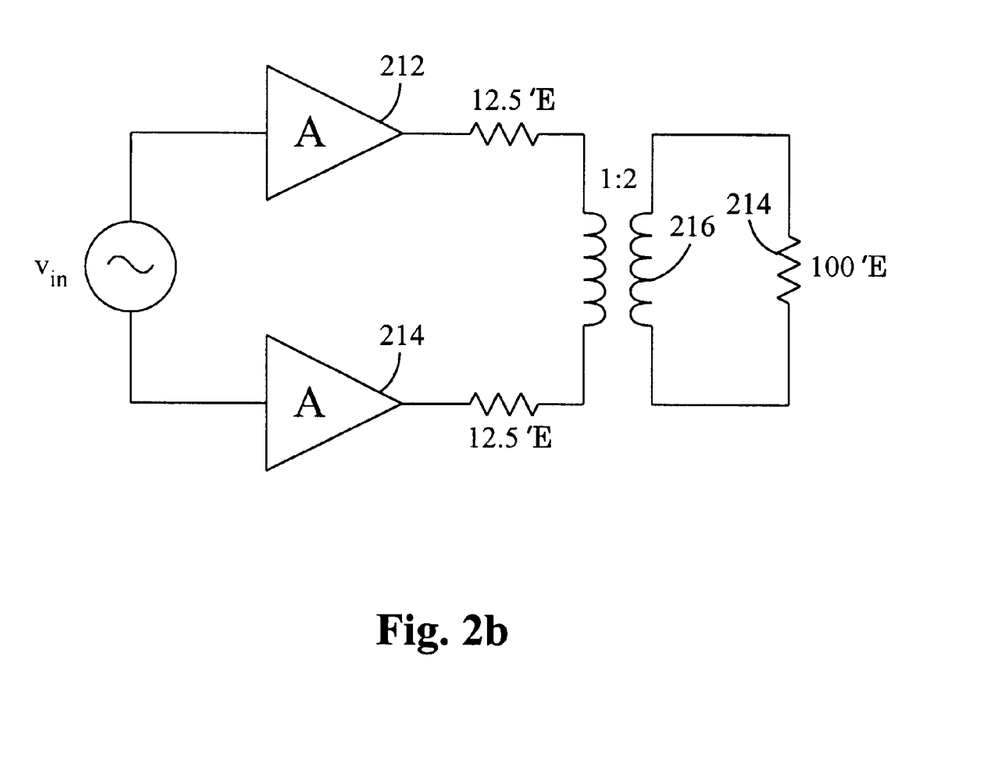
FIG. 2b is a simplified schematic of an ADSL line driver driving a subscriber loop.

The techniques of the present invention may be applied to any class of amplifier or line driver including classes A, B, AB, C, D, E, F, G, and H. Generalized embodiments of the invention will be discussed first. Then a specific embodiment of the invention implemented as a class G amplifier will be described. When amplifiers and line drivers are used to deliver power to a low impedance load, a low distortion design becomes challenging. Examples of an amplifier and a line driver driving low impedance loads are shown in FIGS. 2a and 2b, respectively. In FIG. 2a, audio amplifier 202 having a gain A=5 drives a 4 ohm loudspeaker. In FIG. 2b, an ADSL line driver (drivers 212 and 214) having a gain A=5 drives an effective load of 25 ohms. The present invention provides techniques for improving the linearity of such amplifiers and line drivers when driving such low impedance loads.

Figure 3:
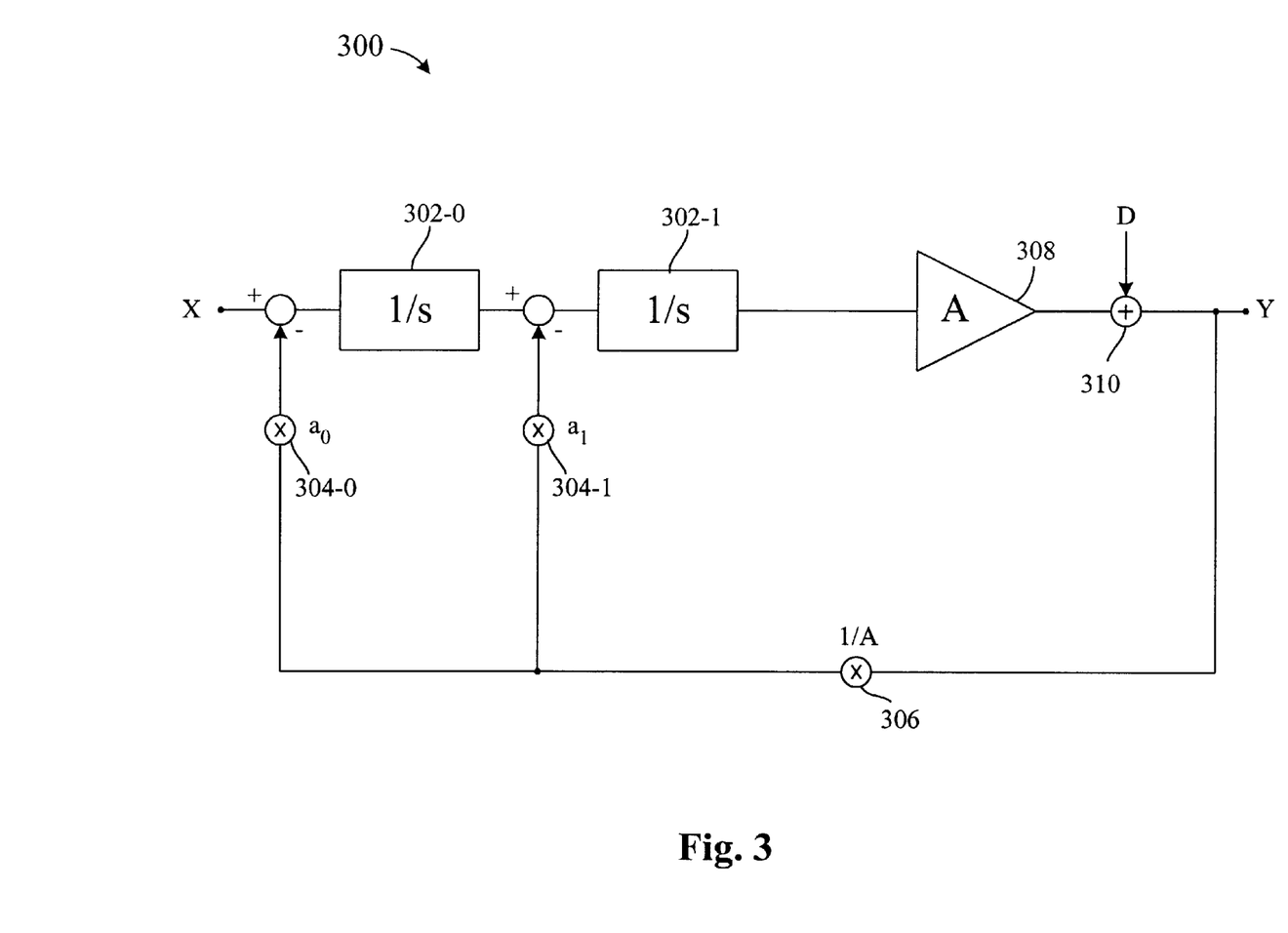
FIG. 3 is a diagram of an improved amplifier with a second order distortion filter according to a specific embodiment of the invention.

FIG. 3 is a diagram of an improved amplifier/line driver 300 with a second order distortion filter according to a specific embodiment of the invention. The distortion filter comprises two integrator stages 302-0 and 302-1 which employ continuous-time feedback from the output Y of amplifier 300 via gain elements 304-0 and 304-1 and 306. The distortion in the output Y is modeled as a summation of the ideal output from amplifier/driver stage 308 and a distortion term D at summing junction 310. Using this model, the transfer functions for output Y to input X and for output Y to distortion term D are as follows:

$$Y(s)/X(s) = A/(s*s + s*a_1 + a_0) \quad (1)$$

$$Y(s)/D(s) = s*s/(s*s + s*a_1 + a_0) \quad (2)$$

where A is the gain of amplifier/driver stage 308;

$a_i$ are feedback coefficients (represented by gain stages 304); and s is the Laplace operator for frequency domain representation.

Figure 4:
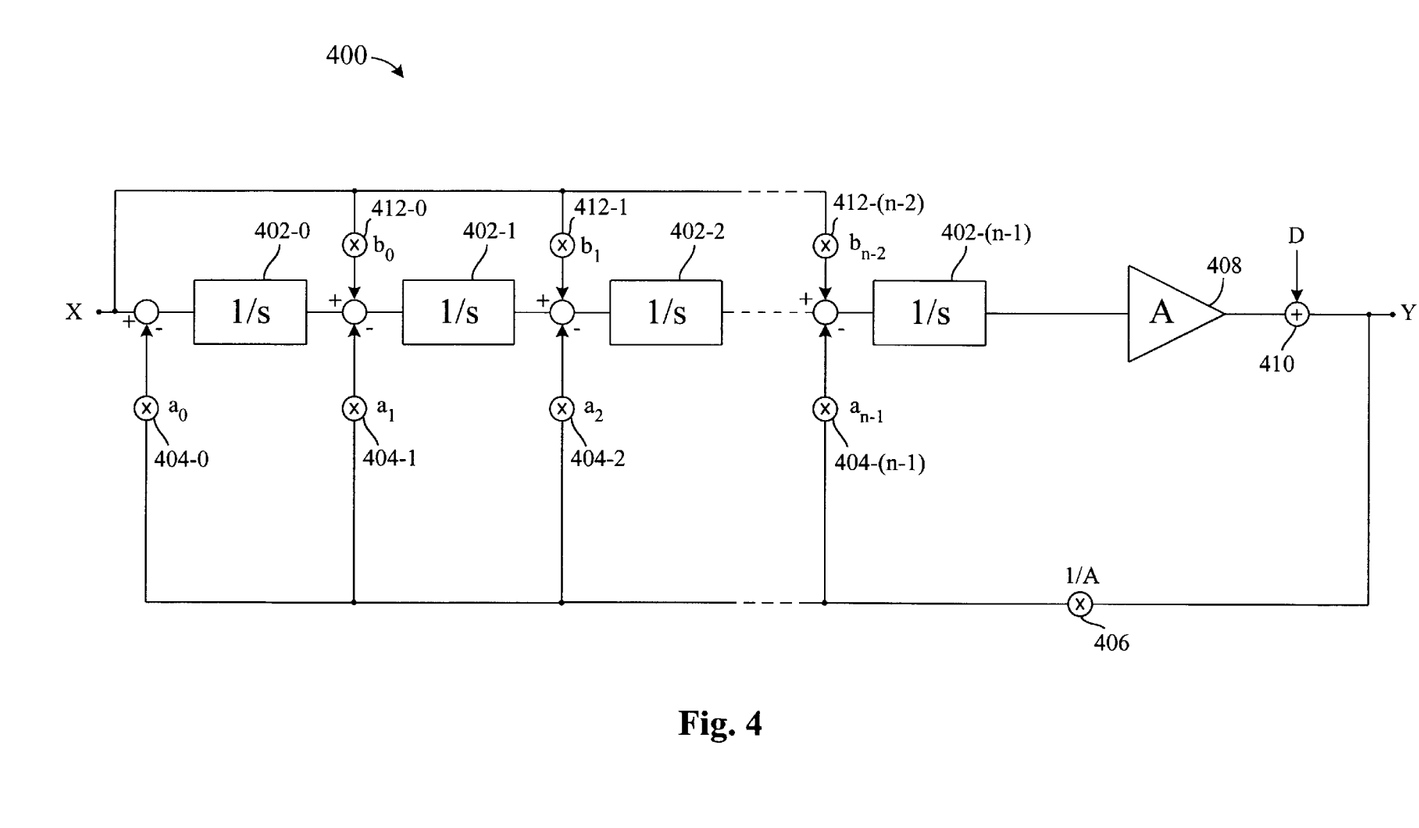
FIG. 4 is a diagram of an improved amplifier with an nth order distortion filter according to a specific embodiment of the invention.

FIG. 4 is a diagram of an improved amplifier/line driver 400 with a generalized n$^{th}$ order distortion filter according to a specific embodiment of the invention. The distortion filter comprises n integrator stages 402-0 through 402-(n−1) which employ continuous-time feedback from the output Y of amplifier 400 via gain stages 404-0 through 404-(n−1) and 406. The distortion in the output Y is modeled as a summation of the ideal output from amplifier stage 408 and a distortion term D at summing junction 410. Using this model, and ignoring for the moment the feed forward path, the transfer functions for output Y to input X and for output Y to distortion term D are as follows:

$$Y(s)/X(s)=A/(s^n+s^{n-1}*a_{n-1}+s^{n-2}*a_{n-2}+ \ldots +s*a_1+a_0) \quad (3)$$

$$Y(s)/D(s)=s^n/(s^n+s^{n-1}*a_{n-1}+s^{n-2}*a_{n-2}+ \ldots +s*a_1+a_0) \quad (4)$$

where A is the gain of amplifier stage 408;

$a_i$ are feedback coefficients (represented by gain stages 404); and s is the Laplace operator for frequency domain representation.

Figure 5:
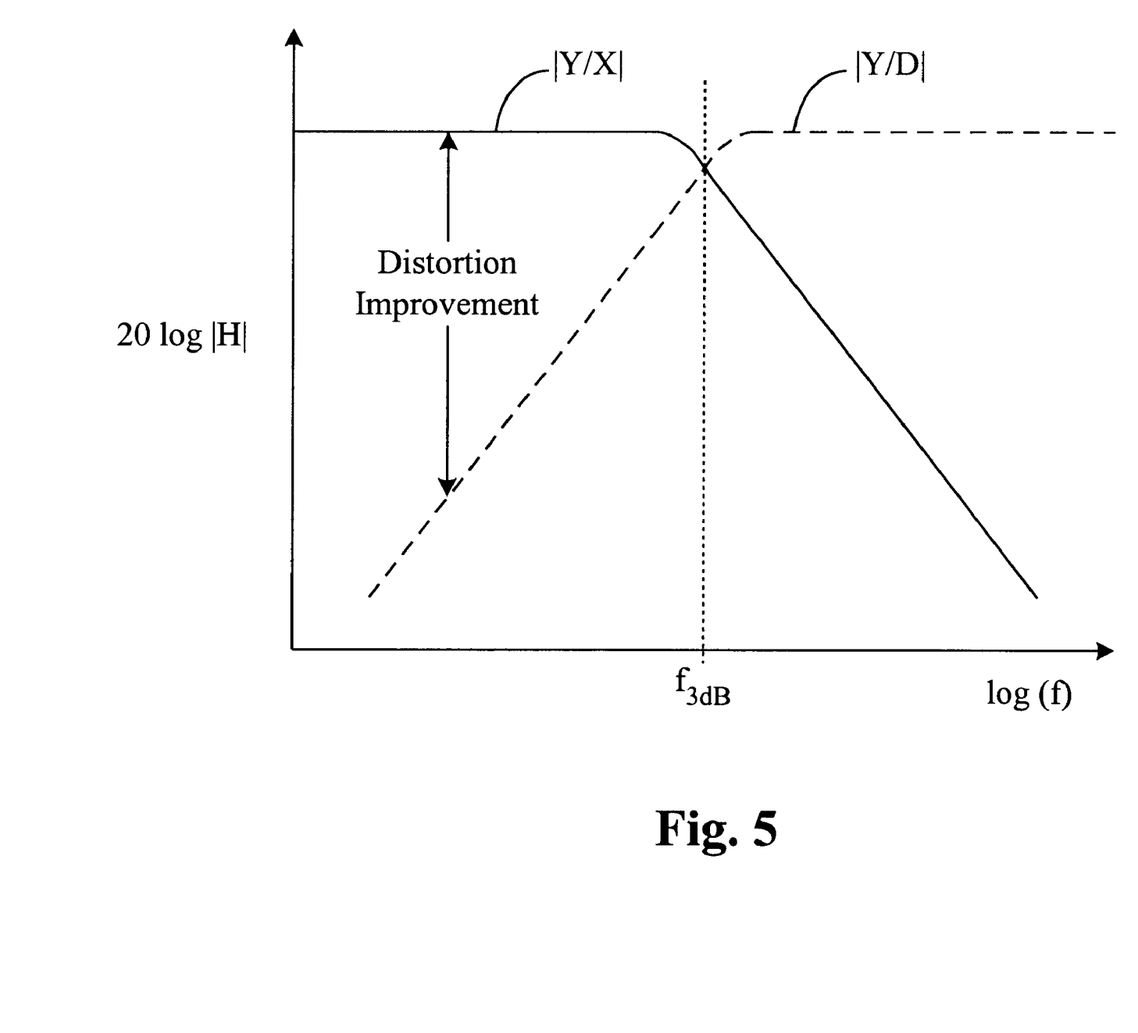
FIG. 5 is a graph illustrating attenuation of distortion according to a specific embodiment of the invention.

For each of the above-described embodiments, appropriate feedback coefficients, $a_i$, are selected such that the transfer function Y(s)/X(s) is made equal to the amplifier stage gain A in the band of interest. The result is attenuation of the distortion term D in the band of interest as shown in FIG. 5. It is apparent that equations (1) and (3) describe low pass filter characteristics while equations (2) and (4) describe high pass filter characteristics. Thus, for either embodiment, a scaled version of input signal X is faithfully reproduced at the output while the distortion introduced by the output stage (i.e., the amplifier/driver stages 308 and 408) and represented by the term D is rejected by the high pass action of the distortion filter. A graphic representation of this is shown in FIG. 5 in which the frequency domain characteristics of Y/X (equations (1) and (3)) and Y/D (equations (2) and (4)) are superimposed. As illustrated, the reduction of distortion in the band of interest is significant.

According to a more specific embodiment, a feed forward path may be provided from the input of amplifier/driver 400 to selected stages via gain elements 412-0 through 412-(n−2) for stabilization purposes. For more information regarding the use and effect of such a feed forward path in the context of sigma-delta modulation techniques, please refer to Candy and Temes, *Oversampling Delta-Sigma Data Converters*, pp. 1–25 (IEEE Press, 1992), the entirety of which is incorporated herein by reference.

Figure 6A:
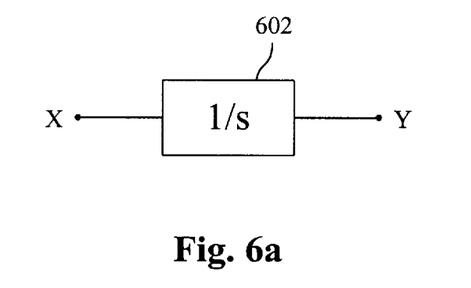
FIG. 6a is a diagram of an ideal integrator.
Figure 6B:
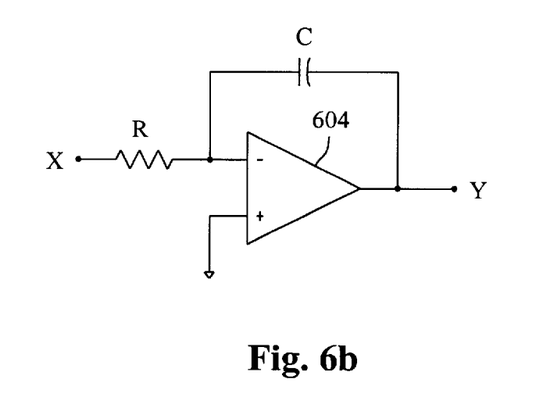
FIG. 6b is a diagram of an op amp RC integrator with a single ended output.
Figure 6C:
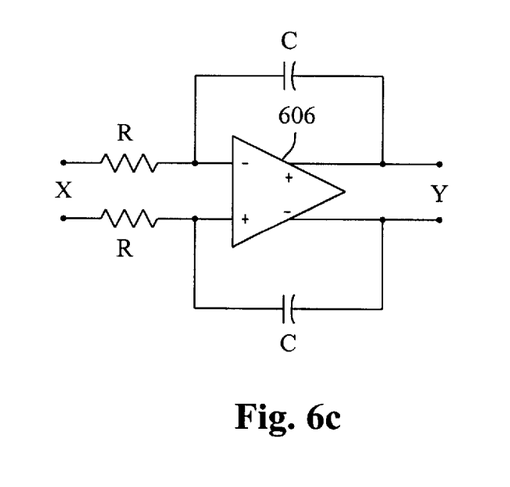
FIG. 6c is a diagram of an op amp RC integrator with a differential output.

More specific embodiments of the invention will now be described with reference to FIGS. 6–9. Various representations of an integrator for use with the present invention are shown in FIGS. 6a–6c. An ideal representation of an integrator 602 (as depicted in the implementations of FIGS. 3 and 4) is shown in FIG. 6a. FIG. 6b is a schematic representation of a single ended inverting integrator based on operational amplifier 604, input resistor R and feedback capacitor C, for use with single ended implementations of the present invention. FIG. 6c is a schematic representation of a differential output inverting integrator based on operational amplifier 604, input resistor R and feedback capacitor C, for use with differential implementations of the present invention. As will be understood, the coefficients associated with the integrators of FIGS. 6b and 6c are both equal to 1/RC. The amplifier/driver topologies described above with reference to FIGS. 3 and 4 may be implemented using either of these integrators.

Figure 7:
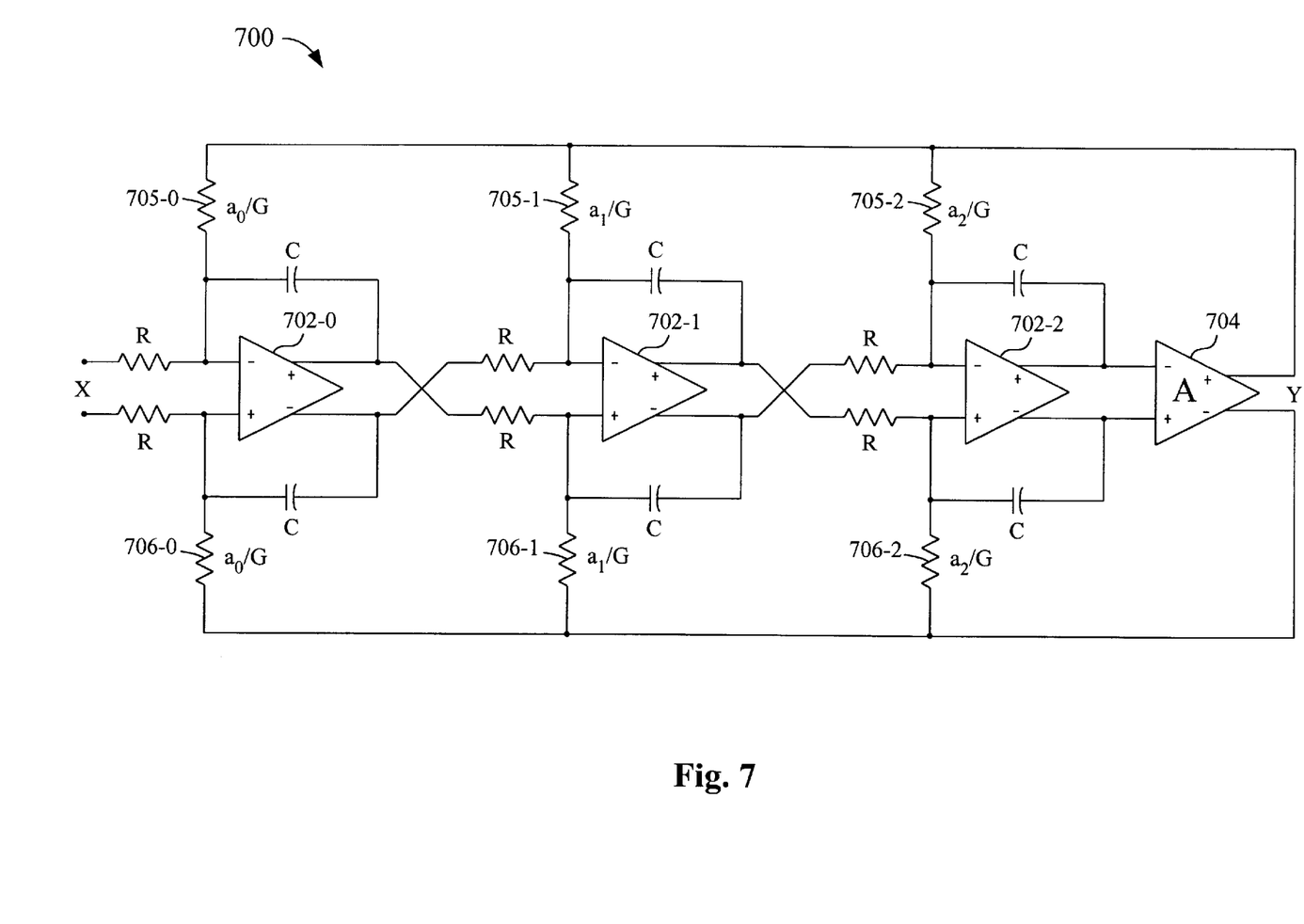
FIG. 7 is a diagram of an improved ADSL differential line driver with a third order is distortion filter according to a specific embodiment of the invention.

A differential output implementation of the present invention using differential integrators will now be described with reference to FIG. 7. FIG. 7 is a diagram of an improved differential amplifier/line driver 700 with a third order distortion filter according to a specific embodiment of the invention. The distortion filter comprises three differential output integrator stages based on operational amplifiers 702-0, 702-1, and 702-2, resistors R and capacitors C. The integrator stages employ continuous-time feedback from the output of amplifier/driver stage 704 via resistor pairs 705-0 and 706-0, 705-1 and 706-1, and 705-2 and 706-2. The distortion improvement realized with this implementation is readily understood with reference to the discussions above for the implementations of FIGS. 3 and 4. Such an embodiment may be used, for example, as a line driver for an ADSL subscriber loop as mentioned above with reference to FIG. 2b.

According to a specific embodiment, the integrators of amplifier/line driver 700 may be implemented with switched capacitors. Depending on the nature of amplifier/driver stage 704 and the rate at which the capacitors are switched, anti-aliasing filters (e.g., low pass filters) may or may not be required in the feedback paths. That is, if output stage 704 does not introduce significant aliasing, or if the capacitors are switched fast enough to eliminate the nonlinear terms generated by the nonlinearity of the output stage, anti-aliasing filters are not necessary.

Figure 8A:
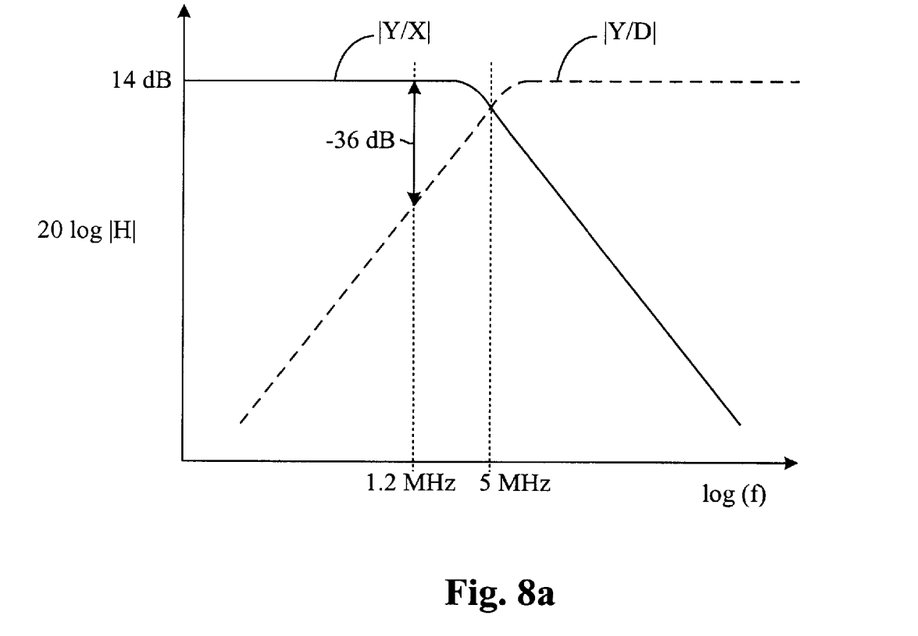
FIGS. 8a and 8b are graphs illustrating attenuation of distortion according to a specific embodiment of the invention.
Figure 8B:
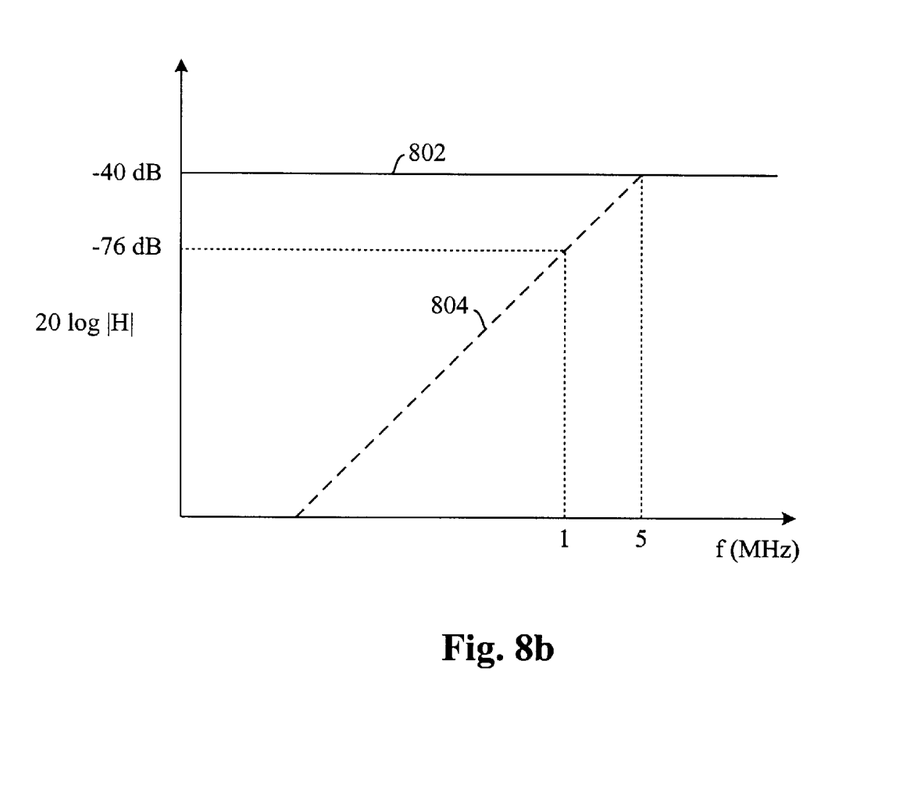

FIGS. 8a and 8b are graphs illustrating attenuation of distortion for the embodiment of FIG. 7 where the input signal X has a bandwidth of 5 MHz. According to a specific embodiment, the coefficients of the integrator stages are chosen to produce a maximally flat response from 0 to 1.2 MHz followed by a −60 dB/decade out of band attenuation, i.e., a Butterworth filter. In this example, the gain of line driver stage 704 is set to 5. The output Y to input X response of amplifier/driver 700 is represented by the solid curve while the output Y to distortion D response is represented by the dashed curve. As discussed above with reference to FIG. 5, the distortion improvement in band is represented by the difference between the two curves.

FIG. 8b shows the distortion improvement with the distortion filter of the present invention over the 5 MHz band. In this example, the amplifier/driver stage 704 is constructed such that its operates with −40 dB of distortion across the band (solid line 802) without the benefit of the distortion filter of the present invention. With the introduction of the distortion filter of the present invention, i.e., the integrator stages of FIG. 7, the improvement (represented by dashed line 804) at 1.2 MHz is −40–36 or −76 dB.

Figure 9A:
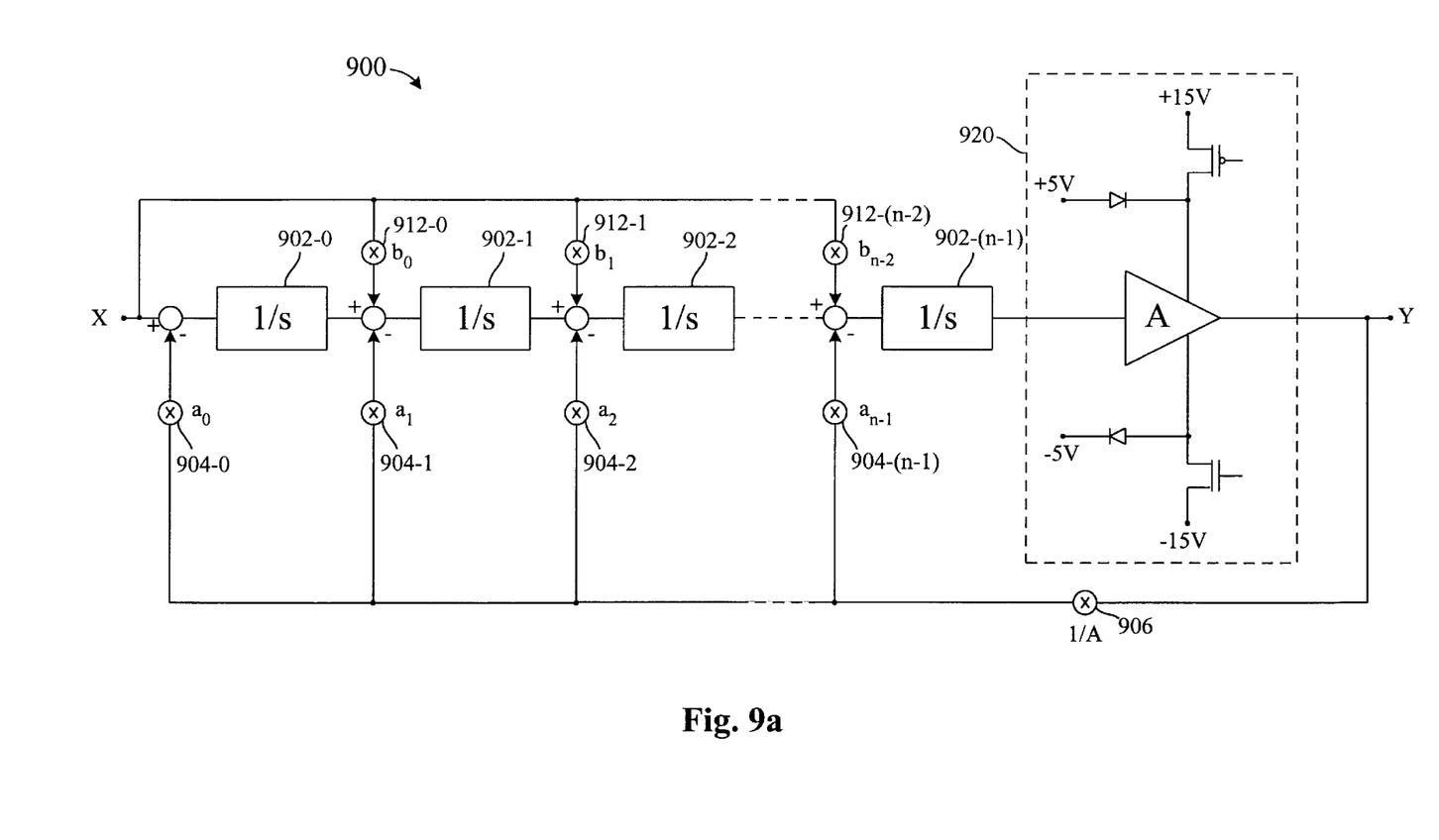
FIGS. 9a, 9b and 9c are diagrams of alternative Class G amplifiers which may be implemented with a distortion filter according to various embodiments of the invention.
Figure 9B:
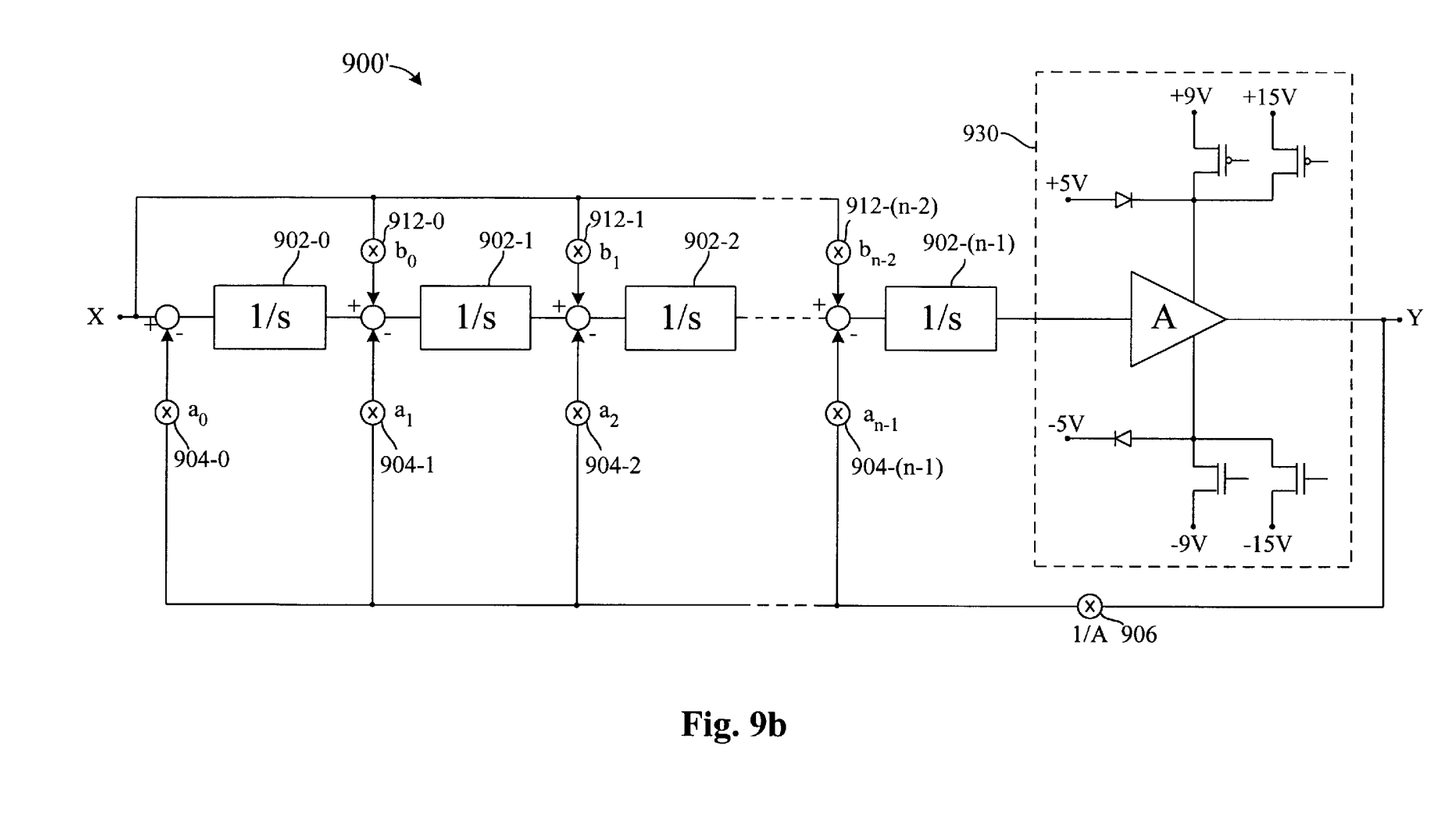
Figure 9C:
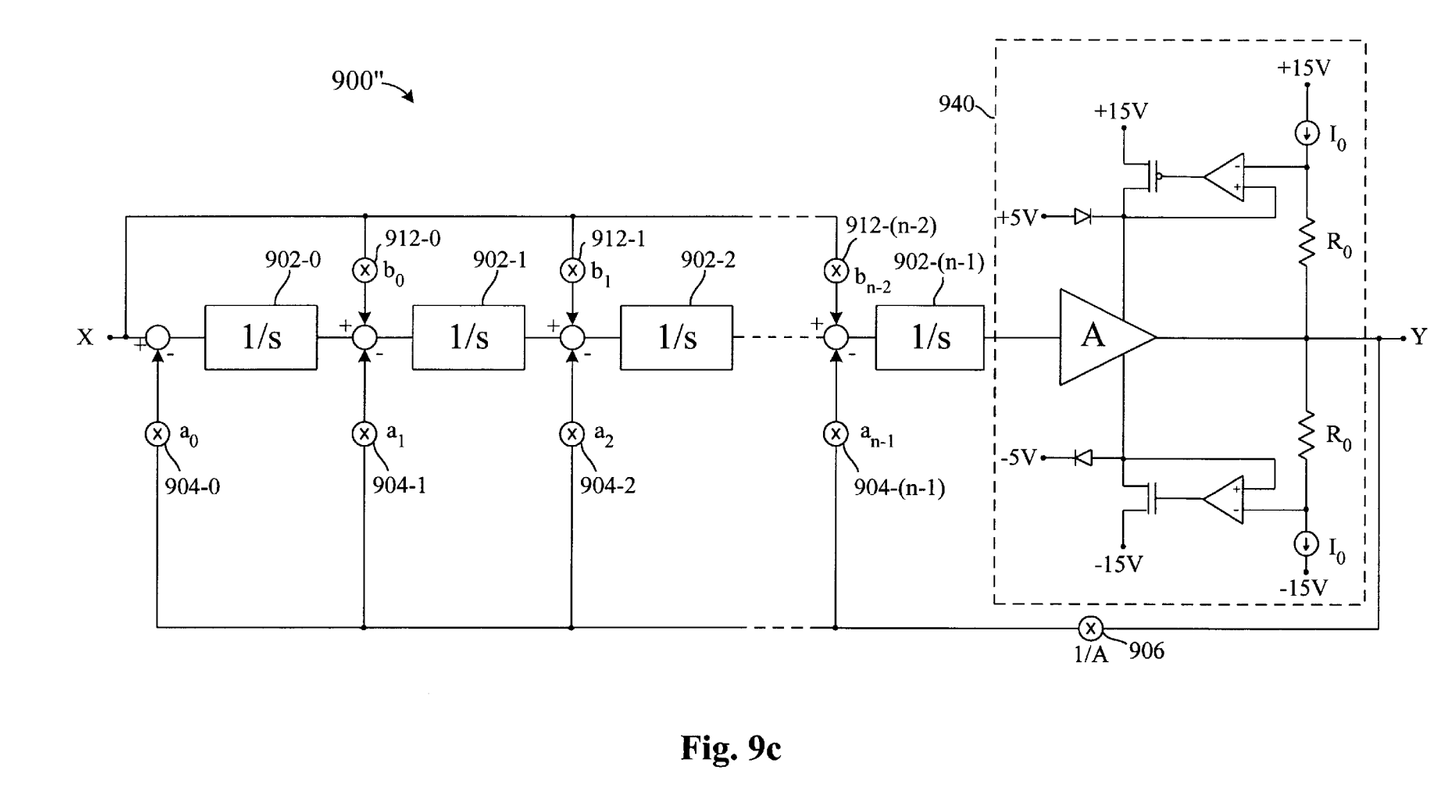

As mentioned above, the distortion filter of the present invention may be employed to enhance the distortion performance of any of a variety of amplifier/driver classes. FIGS. 9a–9c show some examples of amplifier/driver implementations for different class G amplifier/driver configurations. In each of FIGS. 9a–9c, the function and operation of similarly numbered elements is the similar to that for the elements described above with reference to FIG. 4. Amplifier 900 of FIG. 9a employs an nth order distortion filter and is based on a simplified class G amplifier/driver 920. Amplifier 900' of FIG. 9b employs an n$^{th}$ order distortion filter and is based on a new class (similar to class G) of amplifier/driver 930 which switches between three supplies, i.e., ±5, ±9, and ±15 volts. Amplifier 900" of FIG. 9c employs an n$^{th}$ order distortion filter and is based on a class G amplifier driver 940 which employs operational amplifiers to drive the transistors which connect and disconnect the ±15 volt supplies with minimal transition glitches.

Figure 10:
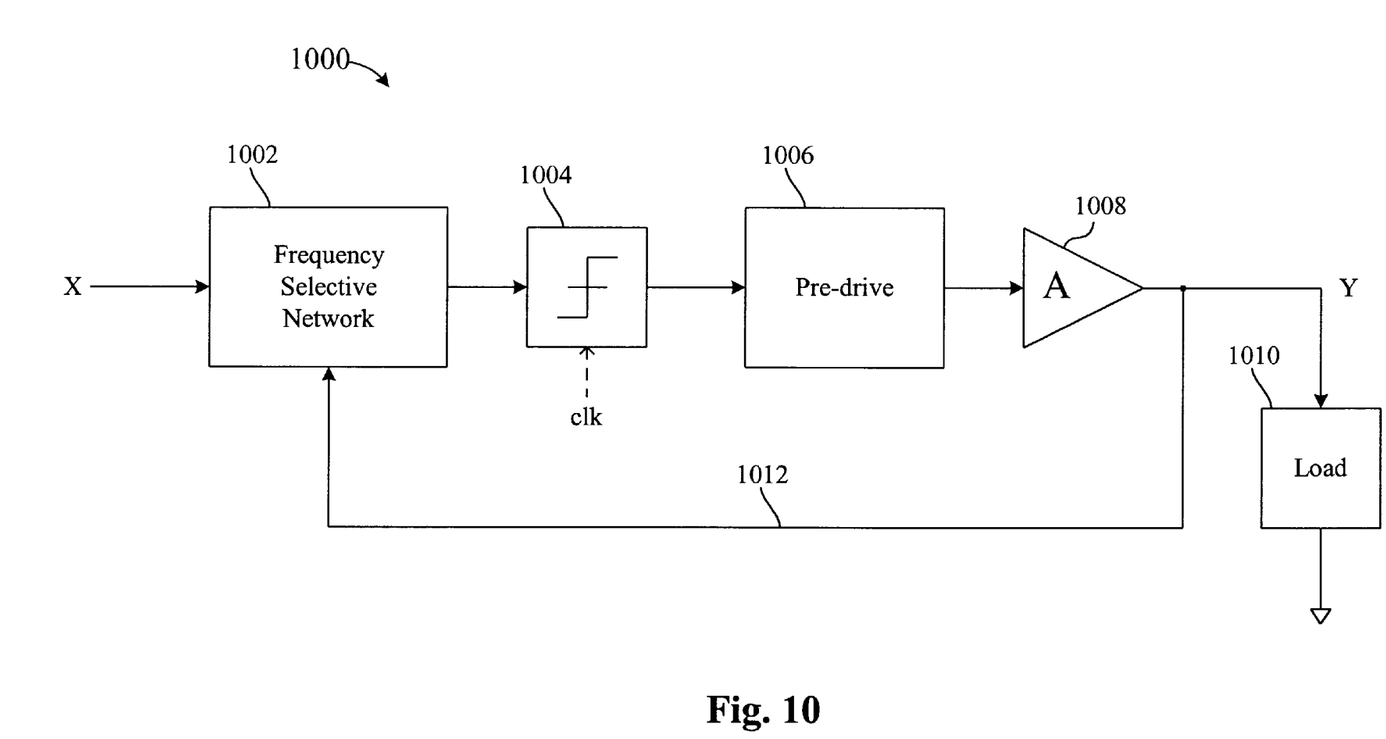
FIG. 10 is a diagram of a resonator-based amplifier/line driver designed according to a specific embodiment of the invention.

FIG. 10 shows an embodiment of an amplifier/driver 1000 which includes a resonator-based frequency selective network 1002. The resonator based network 1002 delivers a noise-shaped signal to a comparator 1004 which, according to various embodiments, may or may not be clocked (as indicated by the dashed arrow). The digital output from comparator 1004 is processed by pre-drive circuitry 1006 and amplified by amplifier/driver stage 1008 which drives load 1010 with an analog output signal. Continuous-time feedback of the analog output signal is provided from the output of amplifier/driver stage 1008 to the resonator-based frequency selective network via feedback path 1012. According to various embodiments, amplifier/driver stage 1008 may comprise a class E or a class F amplifier/driver.

Figure 11:
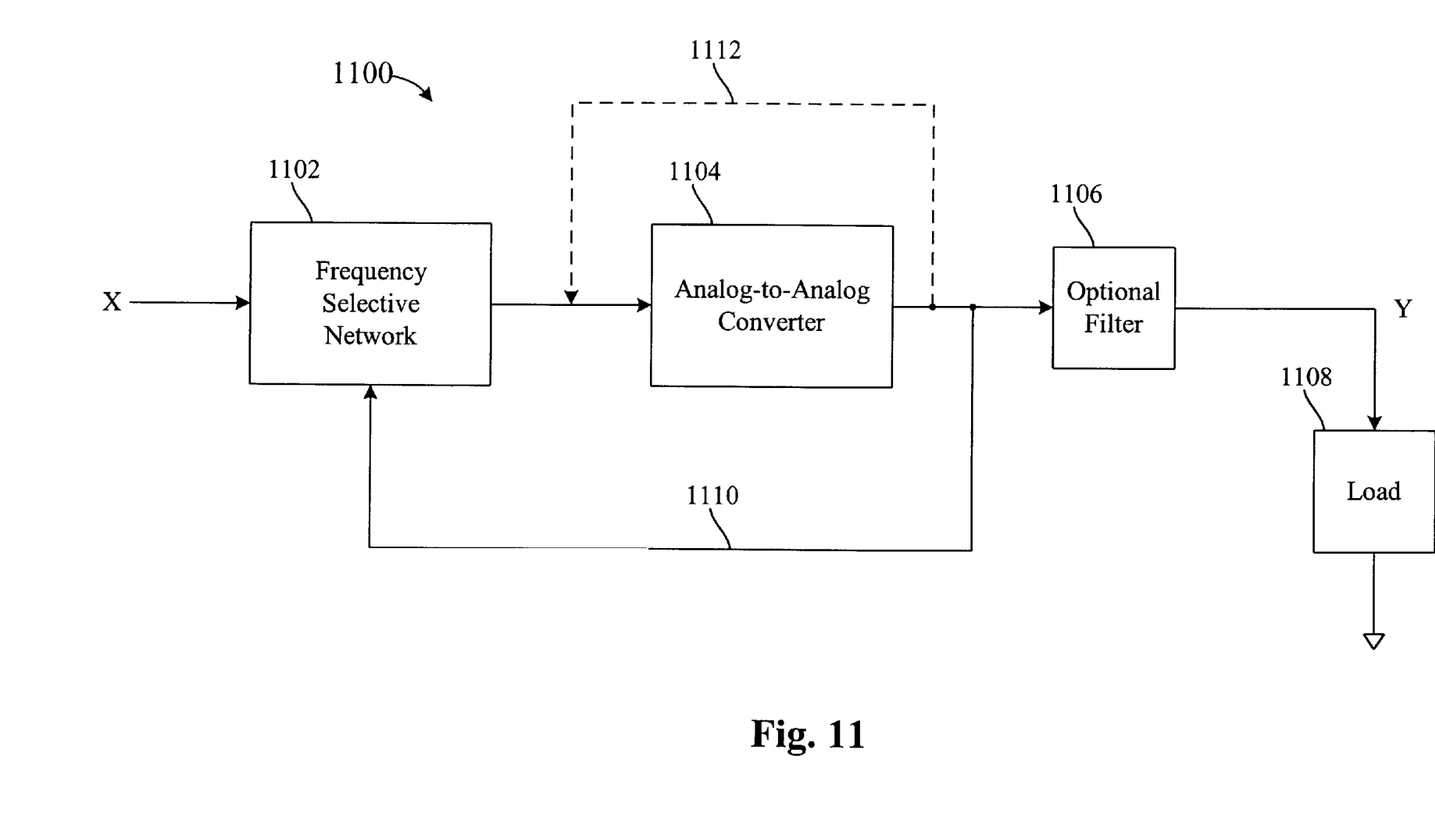
FIG. 11 is a block diagram of a generalized embodiment of the present invention.

While the invention has been particularly shown and described with reference to specific embodiments thereof, it will be understood by those skilled in the art that changes in the form and details of the disclosed embodiments may be made without departing from the spirit or scope of the invention. That is, as discussed above, the present invention may be used with a wide variety of amplifier/driver classes. A generalized embodiment is shown in FIG. 11 to emphasize this point. Amplifier/driver 1100 of FIG. 11 comprises frequency selective network 1102 in a feedback loop with a nonlinear analog-to-analog converter 1104. An optional output filter 1106 delivers the output signal to a load 1108. Continuous-time feedback is provided to frequency selective network 1102 from the output of analog-to-analog converter 1104 via feedback path 1110.

According to specific base band or low pass embodiments, frequency selective network 1102 comprises an $n^{th}$ order distortion filter based on integrators as described above with reference to FIGS. 4, 6 and 7. According to other band pass embodiments, frequency selective network comprises an $n^{th}$ order distortion filter based on, for example, resonators.

It is also important to note that in cases where analog-to-analog converter 1104 has gain, it is possible to make it operate as the final stage of the frequency selective network as represented by dashed feedback path 1112. That is, analog-to-analog converter 1104 could act as a nonlinear stage of frequency selective network 1102 with its own "feedback correction." In the base band embodiment described above with reference to FIG. 4, feedback path 1112 could be, for example, a capacitor across amplifier/driver 408. Such an arrangement can be desirable (depending on the nonlinearities) because the feedback capacitor can quickly adjust for the nonlinearities and correct them before they have a chance to mix down to lower frequencies.

It should also be noted that frequency selective network 1102 of amplifier/driver 1100 does not suffer from the same slew rate limitations as, for example, an op amp. That is, if a step input were introduced to an op amp, slewing would occur due to the inherent limitations in the device. By contrast, the frequency selective network of the present invention is configured such that, even for a step input, it maintains a linear transfer function, e.g., an RC response, rather than slewing. This is important in that discontinuities are handled much better by the present invention than traditional op amp circuits. Therefore, in view of the foregoing, the scope of the invention should be determined with reference to the appended claims.

What is claimed is:

1. A signal processing circuit, comprising:
    an $n^{th}$ order distortion filter in a feedback loop, n being greater than one;
    an amplifier in the feedback loop coupled to the distortion filter, the amplifier employing one of a plurality of power supply voltages for each of a plurality of output signal ranges, the amplifier introducing nonlinearities into the feedback loop related at least in part to switching between the power supply voltages; and
    at least one linear, continuous-time feedback path from the amplifier to the distortion filter, the at least one continuous-time feedback path facilitating correction of the nonlinearities.

2. The signal processing circuit of claim 1 wherein the distortion filter comprises a plurality of integrator stages.

3. The signal processing circuit of claim 2 wherein the distortion filter comprises 2 integrator stages.

4. The signal processing circuit of claim 2 wherein the distortion filter comprises 3 integrator stages.

5. The signal processing circuit of claim 2 wherein the distortion filter comprises a Butterworth filter.

6. The signal processing circuit of claim 1 wherein the distortion filter comprises a plurality of resonator stages.

7. The signal processing circuit of claim 1 wherein the amplifier comprises a class G amplifier.

8. The signal processing circuit of claim 1 wherein the at least one continuous-time feedback path comprises a plurality of feedback elements which determine a coefficient for each of a plurality of stages of the distortion filter.

9. The signal processing circuit of claim 1 wherein the at least one continuous-time feedback path comprises scaling elements.

10. The signal processing circuit of claim 1 wherein the amplifier comprises an input terminal and an output terminal, and wherein the at least one continuous-time feedback path includes a first feedback path from the output terminal to the input terminal.

11. A line driver for a digital subscriber line comprising the signal processing circuit of claim 1.

12. The line driver of claim 11 wherein the digital subscriber line comprises an ADSL line.

13. A method for driving a digital subscriber line comprising driving the digital subscriber line using the signal processing circuit of claim 1.

14. An audio amplifier comprising the signal processing circuit of claim 1.

15. A method for processing a first signal using an amplifier which employs one of a plurality of power supply voltages for each of a plurality of output signal ranges, the amplifier introducing nonlinearities into the feedback loop related at least in part to switching between the power supply voltages, the method comprising:
    receiving the first signal with an $n^{th}$ order distortion filter where n is greater than one, and generating a filtered signal in response thereto;
    receiving the filtered signal from the frequency selective network with amplifier and generating a second signal in response thereto; and
    feeding the second signal back to the distortion filter via at least one linear, continuous-time feedback path, thereby facilitating correction of the nonlinearities.

16. The method of claim 15 wherein the first signal comprises an ADSL signal.

* * * * *